(12) United States Patent
Miller et al.

(10) Patent No.: US 8,994,071 B2
(45) Date of Patent: Mar. 31, 2015

(54) SEMICONDUCTOR DEVICES GROWN ON INDIUM-CONTAINING SUBSTRATES UTILIZING INDIUM DEPLETION MECHANISMS

(75) Inventors: Thomas J. Miller, Woodbury, MN (US); Michael A. Haase, St. Paul, MN (US); Xiaoguang Sun, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 658 days.

(21) Appl. No.: 13/264,509

(22) PCT Filed: Apr. 30, 2010

(86) PCT No.: PCT/US2010/033131
§ 371 (c)(1),
(2), (4) Date: Oct. 14, 2011

(87) PCT Pub. No.: WO2010/129409
PCT Pub. Date: Nov. 11, 2010

(65) Prior Publication Data
US 2012/0037957 A1 Feb. 16, 2012

Related U.S. Application Data

(60) Provisional application No. 61/175,632, filed on May 5, 2009.

(51) Int. Cl.
*H01L 29/22* (2006.01)
*H01L 33/28* (2010.01)
(Continued)

(52) U.S. Cl.
CPC ...... *H01L 33/0087* (2013.01); *H01L 21/02392* (2013.01); *H01L 21/02463* (2013.01);
(Continued)

(58) Field of Classification Search
CPC .......... H01L 21/02469; H01L 21/0248; H01L 21/02472; H01L 21/02474; H01L 21/02477; H01L 21/02551; H01L 21/02554; H01L 21/02557; H01L 21/0256; H01L 21/02562

See application file for complete search history.

(56) References Cited

U.S. PATENT DOCUMENTS 3,526,801 A 9/1970 Kruse
5,048,035 A 9/1991 Sugawara
(Continued)

FOREIGN PATENT DOCUMENTS

DE 103 54 936 4/2005
EP 1 010 773 6/2000
(Continued)

OTHER PUBLICATIONS

Cavus et al., "N-type doping of lattice-matched ZnCdSe and ZnxCdyMg1-x-ySe epilayers on InP using ZnCl2", Journal of Applied Physics, vol. 84, No. 3, pp. 1472-1475, Aug. 1, 1998, © 1998 American Institute of Physics.
(Continued)

*Primary Examiner* — Shaun Campbell
*Assistant Examiner* — Raj R Gupta
(74) *Attorney, Agent, or Firm* — Yufeng Dong; Kristofor L. Storvick (57) ABSTRACT

We have observed anomalous behavior of II-VI semiconductor devices grown on certain semiconductor substrates, and have determined that the anomalous behavior is likely the result of indium atoms from the substrate migrating into the II-V layers during growth. The indium can thus become an unintended dopant in one or more of the II-VI layers grown on the substrate, particularly layers that are close to the growth substrate, and can detrimentally impact device performance. We describe a variety of semiconductor constructions and techniques effective to deplete the migrating indium within a short distance in the growth layers, or to substantially prevent indium from migrating out of the substrate, or to otherwise substantially isolate functional II-VI layers from the migrating indium, so as to maintain good device performance.

12 Claims, 3 Drawing Sheets

(51) Int. Cl.
*H01L 33/00* (2010.01)
*H01L 21/02* (2006.01)
*H01L 33/08* (2010.01)
*H01L 33/50* (2010.01)

(52) U.S. Cl.
CPC .... *H01L 21/02466* (2013.01); *H01L 21/02469* (2013.01); *H01L 21/0256* (2013.01); *H01L 21/02568* (2013.01); *H01L 21/02576* (2013.01); *H01L 33/08* (2013.01); *H01L 33/28* (2013.01); *H01L 21/02631* (2013.01); *H01L 33/502* (2013.01)
USPC ........................................................ 257/191

(56) References Cited

U.S. PATENT DOCUMENTS

| | | | |
|---|---|---|---|
| 5,574,296 A * | 11/1996 | Park et al. | 257/103 |
| 5,600,158 A | 2/1997 | Noto | |
| 5,861,717 A | 1/1999 | Begemann | |
| 6,016,038 A | 1/2000 | Mueller | |
| 6,636,003 B2 | 10/2003 | Rahm | |
| 6,902,987 B1 | 6/2005 | Tong | |
| 7,026,653 B2 | 4/2006 | Sun | |
| 7,078,319 B2 | 7/2006 | Eliashevich | |
| 7,126,160 B2 | 10/2006 | Sun | |
| 7,141,445 B2 | 11/2006 | Sugawara | |
| 7,202,613 B2 | 4/2007 | Morgan | |
| 7,217,959 B2 | 5/2007 | Chen | |
| 7,223,998 B2 | 5/2007 | Schwach | |
| 7,279,716 B2 | 10/2007 | Chen | |
| 7,288,902 B1 | 10/2007 | Melanson | |
| 7,358,679 B2 | 4/2008 | Lys | |
| 7,361,938 B2 | 4/2008 | Mueller | |
| 7,387,405 B2 | 6/2008 | Ducharme | |
| 7,402,831 B2 | 7/2008 | Miller | |
| 7,417,260 B2 | 8/2008 | Wuu | |
| 2002/0182319 A1 | 12/2002 | Ben-Malek | |
| 2003/0010987 A1 | 1/2003 | Banin | |
| 2005/0110034 A1 | 5/2005 | Fujiwara | |
| 2005/0230693 A1 | 10/2005 | Chen | |
| 2005/0274967 A1 | 12/2005 | Martin | |
| 2005/0280013 A1 | 12/2005 | Sun | |
| 2006/0001056 A1 | 1/2006 | Saxler | |
| 2006/0124917 A1 | 6/2006 | Miller | |
| 2006/0202215 A1 | 9/2006 | Wierer, Jr. | |
| 2007/0221867 A1 | 9/2007 | Beeson | |
| 2007/0284565 A1 | 12/2007 | Leatherdale | |
| 2007/0290190 A1 | 12/2007 | Haase | |
| 2008/0111123 A1 | 5/2008 | Tu | |
| 2008/0230795 A1 | 9/2008 | Dias | |
| 2008/0272712 A1 | 11/2008 | Jalink | |
| 2008/0297027 A1 | 12/2008 | Miller | |
| 2009/0014736 A1 | 1/2009 | Ibbetson | |
| 2009/0108269 A1 | 4/2009 | Negley | |
| 2010/0117997 A1 | 5/2010 | Haase | |

FOREIGN PATENT DOCUMENTS

| | | | | |
|---|---|---|---|---|
| EP | 1 517 379 | 3/2005 | | |
| JP | 61-144078 | 7/1986 | | |
| JP | 2000-091707 | 3/2000 | | |
| JP | 2000091707 A * | 3/2000 | ............. | H01S 5/327 |
| KR | 10-0829925 | 8/2008 | | |
| WO | WO 00/76005 | 12/2000 | | |
| WO | WO 2006/062588 | 6/2006 | | |
| WO | WO 2007/034367 | 3/2007 | | |
| WO | WO 2007/073449 | 6/2007 | | |
| WO | WO 2007/114614 | 10/2007 | | |
| WO | WO 2008/109296 | 9/2008 | | |
| WO | WO 2009/036579 | 3/2009 | | |
| WO | WO 2009/048704 | 4/2009 | | |
| WO | WO 2009/148717 | 12/2009 | | |
| WO | WO 2009/158191 | 12/2009 | | |
| WO | WO 2010/019594 | 2/2010 | | |
| WO | WO 2010/027648 | 3/2010 | | |
| WO | WO 2010/028146 | 6/2010 | | |
| WO | WO 2009/158138 | 7/2010 | | |
| WO | WO 2010/074987 | 7/2010 | | |
| WO | WO 2010/033379 | 11/2010 | | |
| WO | WO 2010/129412 | 11/2010 | | |
| WO | WO 2011/002686 | 1/2011 | | |
| WO | WO 2011/008474 | 1/2011 | | |
| WO | WO 2011/008476 | 1/2011 | | |

OTHER PUBLICATIONS

Chang et al., "MBE Growth and Characterization of (ZnMG) (SeTe)", Journal of the Korean Physical Society, vol. 34, pp. S4-S6, Apr. 1999.

Cie, International Commission on Illumination, Technical Report, ISBN 978 3 900734 57 2, 13.3, 1995.

Guo et al., "Photon Recycling Semiconductor Light Emitting Diode", IEEE Xplore, 4 pages, Downloaded on Oct. 29, 2008, © 1999 IEEE.

Horng et al., "Phosphor-Free White Light From InGaN Blue and Green Light-Emitting Diode Chips Covered With Semiconductor-Conversion AlGaInP Epilayer", IEEE Photonics Technology Letters, vol. 20, No. 13, pp. 1139-1141, Jul. 1, 2008.

Horng et al., "Red-enhanced white light-emitting diodes using external AlGaInP epilayers with various aperture ratios", Journal of Luminescence, vol. 128, pp. 647-651, 2008, © 2007 Elsevier B.V.

Jones, E. D., "Diffusion of Indium Into Cadmium Sulphide", Journal of Physical Chemistry Solids, vol. 39, pp. 11-18, Pergamon Press, Great Britain, 1978.

Kobayashi, Naoki, "Single quantum well photoluminescence in ZnSe/GaAs/AlGaAs grown by migration-Enhanced epitaxy", Applied Physics Letters, vol. 55, No. 12, pp. 1235-1237, Sep. 18, 1989, © 1989 American Institute of Physics.

Krystek, M., "An Algorithm to Calculate Correlated Colour Temperature", Color Research and Application, vol. 10, pp. 38-40, © 1985 by John Wiley & Sons, Inc.

Litz et al., "Epitaxy of Zn1-xMgxSeyTe1-y on (100) InAs", Journals of Crystal Growth, vol. 159, pp. 54-57, 1999.

Odnoblyudov, V.A. and Tu, C. W., "Gas-source molecular-beam eptitaxial growth of Ga(In)NP on GaP(100) substrates for yellow-amber light-emitting devices", Journal of Vacuum Science and Technology B, vol. 23, No. 3, pp. 1317-1319, May/Jun. 2005, © 2005 American Vacuum Society.

Official Journal of the European Union, "Directive 2002/95/EC of the European Parliament and of the Council, of Jan. 27, 2003, on the restriction of the use of certain hazardous substances in electrical equipment", pp. L 37/19 to L 37/23, Feb. 2, 2003.

Official Journal of the European Union, "Commission Decision, of Aug. 18, 2005, amending Directive 2002/95/EC of the European Parliament and of the Council for the purpose of establishing the maximum concentration values for certain hazardous substances in electrical and electronic equipment", 2005/618/EC, p. L 214/65, Aug. 19, 2005.

Sethi, B.R. and Mather P. C., "Effect of Heavy Doping of ZnSe Crystals with Indium in Creating Compensating Acceptors", Physica Status Solidi. (a), pp. 717-721, 1978.

Search Report for International Application No. PCT/US2010/033131, 4 pages, Date of Mailing Aug. 13, 2010.

Schubert, Fred E., Light Emitting Diodes, pp. 133-144, Second Edition, Universtity Press, Cambridge, U.K., © E. Fred Schubert, 2006.

Schubert, Fred E., Light Emitting Diodes, pp. 209-211, Second Edition, Universtity Press, Cambridge, U.K., © E. Fred Schubert, 2006.

Takashima et al., "Proposal of a novel BeZnSeTe quaternary for II-VI middle range visible light emitting devices on InP substrates", Physica Status Solidi (b), vol. 241, No. 3, pp. 747-750, © 2004 Wiley-VCH.

Zeng et al., "Red-green-blue photopumped lasing from ZnCdMgSe/ZnCdSe quantum well laser structures grown on Inp", Applied Physics Letters, vol. 72, No. 24, pp. 3136-3138, Jun. 15, 1998, © 1998 American Institute of Physics.

Written Opinion for International Application No. PCT/US2010/033131, 10 pages, Date of Mailing Aug. 13, 2010.

* cited by examiner

United States Patent US 8,994,071 B2

SEMICONDUCTOR DEVICES GROWN ON INDIUM-CONTAINING SUBSTRATES UTILIZING INDIUM DEPLETION MECHANISMS

CROSS REFERENCE TO RELATED APPLICATIONS

This application is a national stage filing under 35 U.S.C. 371 of PCT/US2010/033131, filed on Apr. 30, 2010, which claims priority to U.S. Provisional Application No. 61/175,632, filed on May 5, 2009, the disclosure of which is incorporated by reference in its/their entirety herein.

RELATED APPLICATIONS

This application is related to the following U.S. patent applications, filed on even date herewith and which are incorporated by reference: U.S. Application No. 61/175,640, "Re-Emitting Semiconductor Construction With Enhanced Extraction Efficiency", and U.S. Application No. 61/175,636, "Re-Emitting Semiconductor Carrier Devices For Use With LEDs and Methods of Manufacture".

FIELD OF THE INVENTION

This invention relates generally to solid state semiconductor devices, including but not limited to semiconductor lighting components.

BACKGROUND

A wide variety of semiconductor devices, and methods of making semiconductor devices, are known. Some of these devices are designed to emit light, such as visible or near-visible (e.g. ultraviolet or near infrared) light. Examples include light emitting diodes (LEDs) and laser diodes. Other devices are designed to detect light. Examples include semiconductor photodiodes and charge coupled devices (CCDs). Still other devices are designed to neither detect nor emit light, but to provide electronic signal functionality. Examples include semiconductor diodes, transistors, and integrated circuit devices.

A re-emitting semiconductor construction (RSC) is an example of a semiconductor device designed to emit light. Unlike an LED, the RSC does not require an electrical drive current from an external electronic circuit in order to emit light. Instead, the RSC generates electron-hole pairs by absorption of light at a first wavelength $\lambda_1$ in an active region of the RSC. These electrons and holes then recombine in potential wells in the active region to emit light at a second wavelength $\lambda_2$ different from the first wavelength $\lambda_1$, and optionally at still other wavelengths $\lambda_3$, $\lambda_4$, and so forth depending on the number of potential wells and their design features. The initiating radiation or "pump light" at the first wavelength $\lambda_1$ is typically provided by a blue, violet, or ultraviolet emitting LED coupled to the RSC. Exemplary RSC devices, methods of their construction, and related devices and methods can be found in, e.g., U.S. Pat. No. 7,402,831 (Miller et al.), U.S. Patent Application Publications US 2007/0284565 (Leatherdale et al.) and US 2007/0290190 (Haase et al.), PCT Publication WO 2009/048704 (Kelley et al.), and pending U.S. Application Ser. No. 61/075,918, "Semiconductor Light Converting Construction", filed Jun. 26, 2008, all of which are incorporated herein by reference.

When reference is made herein to a light at a particular wavelength, the reader will understand that reference is being made to light having a spectrum whose peak wavelength is at the particular wavelength.

The RSC is typically fabricated by growing a series of semiconductor layers atop a semiconductor substrate using epitaxial growth techniques. The substrate material is selected such that it can provide a surface that has at least an approximate lattice match to the crystal lattice of the device layers to be grown. This selection criterion may require a semiconductor substrate whose crystal matrix incorporates indium. One known substrate used in the fabrication of RSCs is indium phosphide (InP). In some cases, the substrate includes a thin buffer layer grown atop a thick base layer, the buffer layer having a different chemical structure than the base layer and providing a pristine surface from which to begin the growth of the device layers. An exemplary buffer layer used in the fabrication of RSCs is gallium indium arsenide (GaInAs) grown atop a base layer of InP.

A vertical cavity surface emitting laser (VCSEL), which can be considered to be a type of RSC, is another example of a semiconductor device designed to emit light. The VCSEL converts at least a portion of a first wavelength light emitted by a pump light source, such as a III-V based pump light source that includes nitrogen, to at least a partially coherent light at a second wavelength. The VCSEL includes first and second mirrors that form an optical cavity for light at the second wavelength. The first mirror is substantially reflective at the second wavelength and includes a first multilayer stack. The second mirror is substantially transmissive at the first wavelength and partially reflective and partially transmissive at the second wavelength. The second mirror includes a second multilayer stack. The VCSEL further includes a semiconductor multilayer stack that is disposed between the first and second mirrors and converts at least a portion of the first wavelength light to the second wavelength light. The semiconductor multilayer stack includes a quantum well that includes a Cd(Mg)ZnSe alloy. Reference is made to pending U.S. Patent Application Ser. No. 61/094,270, "Diode-Pumped Light Source", filed Sep. 4, 2008, incorporated herein by reference.

BRIEF SUMMARY

We have observed anomalous behavior of II-VI semiconductor devices grown on certain semiconductor substrates, and have determined that the anomalous behavior is likely the result of indium atoms from the substrate migrating into the II-VI layers during growth. The indium can thus become an unintended dopant in one or more of the II-VI layers grown on the substrate, particularly layers that are close to the growth substrate, and can detrimentally impact device performance. The unintended indium dopant may, for example, counteract or neutralize the effects of one or more other dopants in the device layers or provide a dark recombination path for minority carriers.

The present application therefore discloses, inter alia, a variety of semiconductor constructions and techniques effective to deplete the migrating indium within a short distance in the growth layers, or to substantially prevent indium from migrating out of the substrate, or to otherwise substantially isolate functional II-VI layers from the migrating indium.

In some embodiments, a semiconductor construction includes a III-V semiconductor substrate that contains indium, and at least first and second II-VI semiconductor layers formed atop the substrate, the first layer being disposed between the second layer and the substrate. The construction also includes an interface disposed between the substrate and the first layer. The substrate and/or the first layer is adapted to limit the migration of indium from the substrate to the second layer. The first layer may include, for example, a dopant such as chlorine in an amount effective to deplete indium that has migrated from the substrate. Alternatively, the first layer may include no dopant effective to deplete migrating indium, but may rather be provided with a thickness that is sufficient to deplete indium migrating from the substrate such that no significant amount of indium reaches the second II-VI layer. In other cases, the substrate may comprise a base layer and a buffer layer, the buffer layer having a major surface corresponding to the interface, and the buffer layer may exhibit an abrupt depletion of indium in monolayers proximate the major surface.

We also disclose a semiconductor construction that includes a III-V semiconductor substrate that contains indium, and a II-VI semiconductor layer formed atop the substrate. The substrate includes a base layer and a buffer layer formed thereon, the base layer being composed of a first III-V semiconductor material that includes indium as a matrix element, and the buffer layer being composed of a second III-V semiconductor material that does not include indium as a matrix element, such that migration of indium from the base layer to the II-VI layer is substantially avoided. The first III-V semiconductor material may be doped or undoped indium phosphide (InP), and the second III-V semiconductor material may be selected from the group of doped or undoped GaAsSb, AlAsSb, and AlGaAsSb.

We also disclose a semiconductor construction that includes a first II-VI semiconductor layer that contains an indium dopant and another dopant, and a second II-VI semiconductor layer formed atop the first layer. The another dopant may be present in the first layer in an amount effective to promote depletion of the indium dopant during a growth phase of the first layer, and the second layer may contain an average concentration of indium that is less than an average concentration of indium in the first layer. The another dopant may comprise aluminum (Al) and/or gallium (Ga), for example, or an n-type dopant selected from the group of aluminum (Al), chlorine (Cl), gallium (Ga), bromine (Br), iodine (I), and fluorine (F).

We also disclose a semiconductor construction that includes a first II-VI semiconductor layer that is nominally lattice-matched to indium phosphide (InP) and that contains an indium dopant. The nominal lattice-matching may be the result of the first II-VI layer being grown on an InP substrate, which substrate was subsequently removed. The indium dopant exhibits a concentration that changes along a thickness direction of the first layer from at least $10^{17}$ atoms/cm$^3$ to less than $10^{16}$ atoms/cm$^3$ over a distance of no more than 1 micron, or over a distance of no more than 0.5 microns.

We also disclose a semiconductor construction that includes a stack of layers, where each layer comprises a II-VI semiconductor material that is nominally lattice-matched to indium phosphide (InP). None of the layers exhibits an indium concentration of more than $10^{16}$ atoms/cm$^3$. Alternately, none of the layers exhibits an indium concentration of more than $10^{15}$ atoms/cm$^3$.

Related methods, systems, and articles are also discussed.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF DRAWINGS

In the figures, like reference numerals designate like elements.

DETAILED DESCRIPTION OF ILLUSTRATIVE EMBODIMENTS

Figure 1:
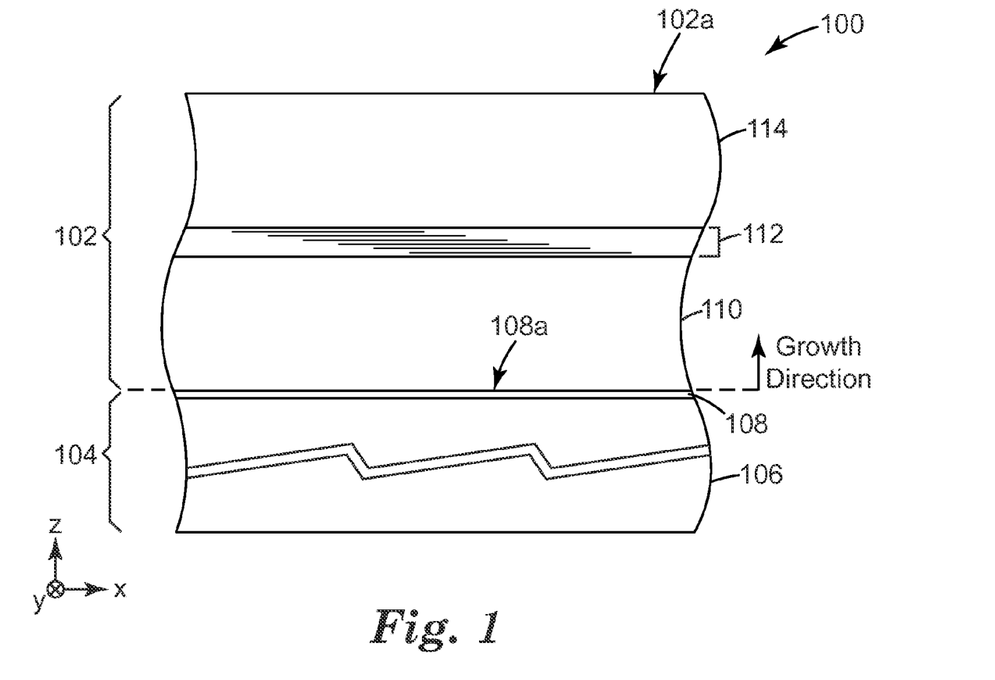
FIG. 1 is a schematic partial side view of a semiconductor construction that includes a representative semiconductor device grown atop a semiconductor substrate.

In FIG. 1, a semiconductor construction 100 includes a semiconductor device 102 grown atop a semiconductor substrate 104. The term "atop" as used herein is not restricted to a particular orientation with respect to the gravitational field of the local environment, but simply refers to one element being disposed on another element, optionally with one or more intermediate elements disposed therebetween, unless otherwise indicated. Thus, a first element may be "atop" a second element even if the first element is disposed on a "bottom" (from the standpoint of gravity) surface of the second element.

Substrate 104 is typically, but not necessarily, in wafer form to facilitate automated handling and processing. The thin, planar shape of the wafer may define a local Cartesian coordinate system as shown where the z-axis (or thickness direction) is perpendicular to the major surfaces of the wafer and the x- and y-axes correspond to lateral, or in-plane, directions. As shown, the substrate 104 includes a substantially monocrystalline semiconductor base layer 106 and a substantially monocrystalline semiconductor buffer layer 108. The base layer 106 is typically thicker than the buffer layer 108 by a factor of at least one hundred, and thus base layer 106 typically provides the substrate 104 with its bulk or macroscopic mechanical properties. The buffer layer 108 is grown atop base layer 106 using molecular beam epitaxy (MBE) or any other suitable technique, after removing any native oxide from the surface of the base layer if needed. The buffer layer 108 preferably provides a substantially defect-free layer with a substantially pristine surface 108a from which the device layers can be grown. The buffer layer 108 can have any desired thickness, but typically is on the order of 1 micrometer (1 micron) or less.

The base layer 106 and buffer layer 108 are composed of a base semiconductor material and a buffer semiconductor material, respectively. In the description that follows, we will presume that both of these semiconductor materials include indium in the crystal matrix of the material, unless otherwise noted. For example, the base semiconductor material may be or comprise indium phosphide (InP), and the buffer semiconductor material may be or comprise gallium indium arsenide (GaInAs) or another semiconductor alloy that incorporates indium. In exemplary embodiments, the base layer 106 and buffer layer 108 each comprise a III-V semiconductor material containing indium.

After the growth substrate 104 and the growth surface 108a are adequately prepared, MBE or any other suitable technique is used to grow or otherwise form the sequence of substantially monocrystalline semiconductor layers that will make up the semiconductor device 102. In the device shown, a first window layer 110 is grown atop surface 108a, followed by group of relatively thinner layers which form an active region 112 of the device, followed by a second window layer 114. The composition, morphology, and thickness of each individual layer is controlled by appropriate selection of source fluxes to be introduced into the growth chamber, and other process parameters such as time and temperature, as will be apparent to those skilled in the art of semiconductor device fabrication. The growth direction is indicated as corresponding to the positive z-direction, as shown.

The device 102 may be representative of any one of a variety of different semiconductor devices, as mentioned above. In some embodiments, the device 102 may be or comprise a vertical cavity surface emitting laser (VCSEL) as described above. In some embodiments, the device 102 may be or comprise a re-emitting semiconductor construction (RSC).

In cases where the device 102 is or includes an RSC, briefly, the active region 112 includes one or more potential wells, and optionally one or more absorbing layers. In the active region, light at a first wavelength $\lambda_1$ is absorbed and generates electron-hole pairs. The electron-hole pairs recombine in the potential well(s) to emit light at a second wavelength $\lambda_2$ different from the first wavelength. In exemplary embodiments, the second wavelength $\lambda_2$ is a visible wavelength, for example, a wavelength corresponding to green, yellow, amber, orange, or red light, and is longer than the first wavelength $\lambda_1$. The initiating radiation or "pump light" at the first wavelength $\lambda_1$ may be provided by a blue, violet, or ultraviolet emitting LED coupled to the RSC. The active region of the RSC may have only one potential well or may include multiple potential wells. In the latter case, the multiple potential wells may be designed to emit light at the same wavelength, or they may be designed to emit light at different wavelengths. In the latter case, not only a second wavelength $\lambda_2$ but also a third wavelength $\lambda_3$ and optionally a fourth wavelength $\lambda_4$, and so forth, may be produced by the different potential wells. The composition of the absorbing layer(s) is selected to provide a transition energy that will provide substantial absorption of light at the first wavelength $\lambda_1$. The thicknesses and arrangement of the absorbing layers relative to the potential well(s) can be engineered for optimal performance based on the absorption characteristics of the absorbing layers and the spectral distribution of the pump source at the first wavelength. The composition of the potential well layer(s) is selected to provide a transition energy less than that of the absorbing layer(s). In some cases it may be desirable to make a given potential well layer sufficiently thin so that quantization maintains the transition energy above the bulk band gap energy of the semiconductor material. Such a potential well can be regarded as a quantum well. In some cases the layer structure in the vicinity of the potential well may be designed such that one or more, or all, of the potential wells are not located within any pn junction.

Still referring to those cases wherein the device 102 is or comprises an RSC, the device may also include window layers 110, 114. One or both of these layers may be grown with a composition whose band gap energy is greater than that of the absorption layer(s) in the active region and greater than the transition energy of the potential well(s). One or both of the window layers 110, 114 may thus be made to be substantially transparent to light at the emitted wavelengths $\lambda_2$, $\lambda_3$, etc. If the band gap energy of such layer(s) is sufficiently high, it or they can also be made to be substantially transparent to pump light at the first wavelength $\lambda_1$. Besides window layers 110, 114 and the thin layers of the active region 112 described above, the RSC may also include other functional layers such as one or more graded composition layers, light filtering layers, reflecting layers, and anti-reflecting layers, for example. An example of a light filtering layer is a layer that absorbs substantially all of the short wavelength light supplied by the pump light source that is not absorbed by the absorbing layer(s), but which highly transmits the re-emitted light originating from the potential well(s), which layer is sometimes referred to as a "cyan blocker". Such a layer may be included on a side of the RSC opposite the side facing the pump light source, i.e., such that the active region and particularly the potential wells of the active region are disposed between the pump light source and the light filtering layer/cyan blocker. The absorptive characteristics of the light filtering layer can be achieved by appropriate adjustment of its band gap energy.

In exemplary embodiments, device 102 and its constituent layers are composed of II-VI semiconductor materials, such as cadmium zinc selenide (CdZnSe) or cadmium magnesium zinc selenide (CdMgZnSe). The band gap energies of these materials can be tailored by suitable adjustment of the relative proportions of the constituent elements in the crystal matrix, as described for example in U.S. Pat. No. 7,402,831 (Miller et al.). Where appropriate, the semiconductors can also be n-doped or p-doped by any suitable method or by inclusion of any suitable dopant. For example, CdMgZnSe can be n-doped by inclusion of chlorine (Cl) atoms. Such doping can be used to promote radiative recombination of electron-hole pairs relative to other recombination mechanisms that may be defect-related and do not contribute to radiative emission.

Figure 2:
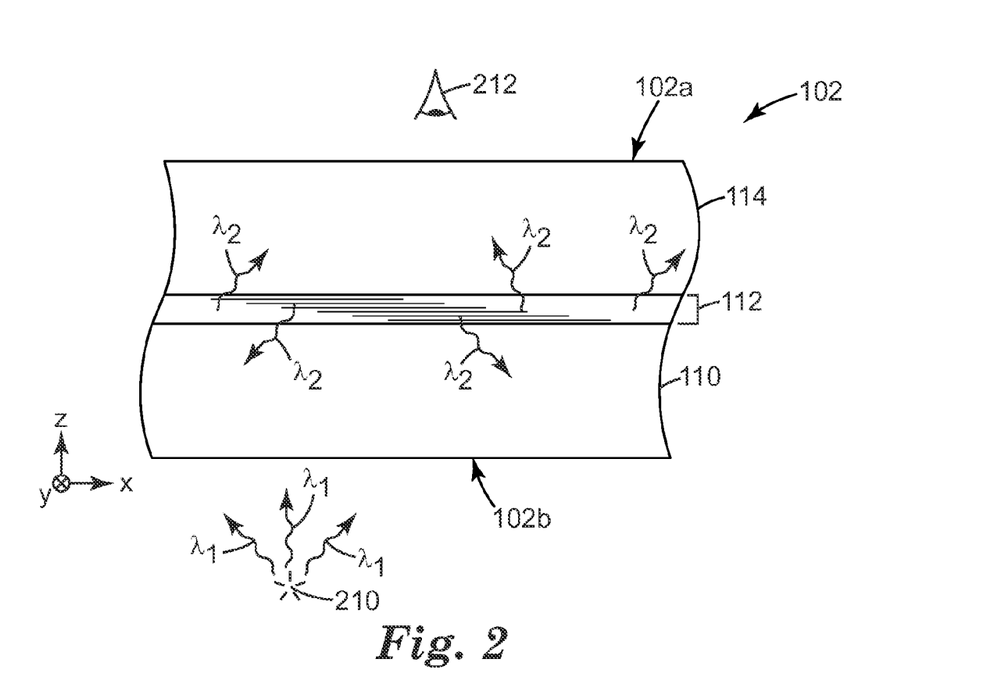
FIG. 2 is a schematic side view of the semiconductor device of FIG. 1 in operation after detachment from the growth substrate.

In many cases it is desirable to isolate the semiconductor device 102 from the growth substrate 104 after the layer growth procedures are completed. An RSC grown on an InP substrate is one such case, because the InP substrate is substantially opaque to visible and ultraviolet light. In such cases, the growth substrate may be removed from the device by grinding, etching, or any other suitable technique that maintains the functional integrity of the device 102. FIG. 2 depicts the device 102 of FIG. 1 after removal of the substrate 104. The outer major surfaces 102a, 102b of the device are referred to herein as an "ending surface" and a "starting surface", respectively, which terms are indicative of the growth order of the device. A light source 210 is provided on one side of the device, and a detector 212 is provided on the other side of the device. The light source 210, which may be or comprise an LED, emits light at a first wavelength $\lambda_1$. At least some of this light, referred to as pump light, enters the RSC at starting surface 102b, traverses window layer 110, and is absorbed in the active region 112. In the active region, energy from the absorbed light is re-emitted by a potential well as light at a second wavelength $\lambda_2$. At least some of this re-emitted light traverses window layer 114, exits the RSC at ending surface 102a, and is collected at the detector 212.

As mentioned above, we have observed anomalous behavior of II-VI semiconductor RSC devices grown on III-V semiconductor substrates that contain indium.

One way the anomalous behavior is manifested is by significant asymmetric performance in devices that are substantially symmetric. For example, embodiments of the device 102 of FIG. 2 can be designed to have substantial mirror symmetry with respect to a reference plane that is parallel to the x-y plane and that bisects the active region 112. In such devices, any given semiconductor layer disposed at a given distance on one side of the reference plane has a substantial counterpart semiconductor layer, with substantially the same composition and thickness, disposed substantially the same given distance on the other side of the reference plane. Such devices are said to have symmetric layer structure. Of course, the reference plane not only bisects the active region 112 but also the overall device 102.

RSCs with substantially symmetric layer structure were fabricated on InP substrates and tested in an integrating sphere, with a 440 nm laser diode used as the pump light source. The devices used II-VI semiconductor layers, including layers of CdMgZnSe and layers of CdZnSe similar to those shown in Table 2 below, in a substantially symmetric stack design. These symmetric devices were expected to give the same photoluminescent efficiency regardless of whether the starting surface (102b) of the device faced the light source, or if instead the ending surface 102a faced the light source. In this regard, "photoluminescent efficiency" refers to a ratio of the total optical power that is re-emitted by the RSC divided by the total optical power that is emitted by the light source 210 and absorbed by the RSC.

However, instead of observing substantially the same photoluminescent efficiency for the two orientations of the symmetric RSC devices, we observed—unexpectedly—significantly different photoluminescent efficiencies. The photoluminescent efficiency for one orientation, the one in which the ending surface 102a faces the light source, was observed to be much greater than the photoluminescent efficiency for the opposite orientation, in which the starting surface 102b faces the light source. The former photoluminescent efficiency was observed to be a factor of 2 or more times the latter photoluminescent efficiency.

The unexpected anomalous behavior was also manifested in capacitance-voltage measurements of the symmetric RSC devices. Those measurements indicated that low levels of chlorine doping in layers of the RSC devices near the starting surface 102b (and thus near the II-VI/III-V interface) had been fully compensated by an unintentional acceptor.

Figure 3:
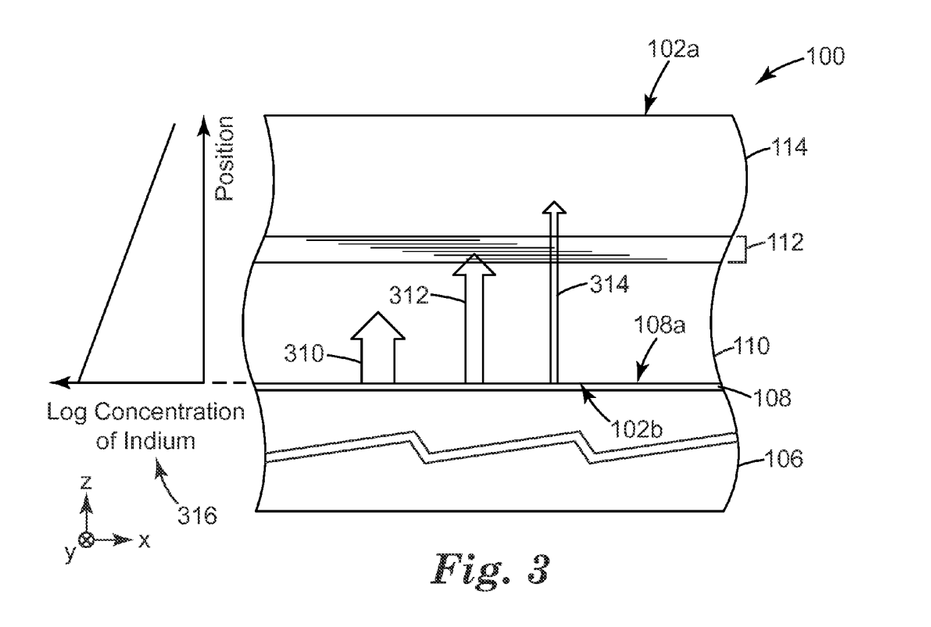
FIG. 3 is a schematic side view of the construction of FIG. 1 with additional drawing elements that illustrate schematically the migration of indium atoms during growth of the device layers, and the resulting concentration profile of indium as a function of depth or position within the device layers.

Further investigation, discussed in more detail below, revealed that substantial numbers of indium atoms from the III-V substrate had migrated a substantial distance into the II-VI layers of the semiconductor device 102 during the MBE growth process, e.g., on the order of 1 micron or more, and this significant (and highly asymmetric) but unintended indium doping was a likely factor in the anomalous behavior. The indium migration is depicted schematically in FIG. 3, where the semiconductor construction 100 from FIG. 1 is reproduced, and arrows 310, 312, 314 are added to the figure to represent in a simplistic fashion indium atoms migrating into the various layers of the device 102 from the substrate 104. The width of arrow 310 is greater than the width of arrow 312, which in turn is greater than that of arrow 314, to indicate that the concentration of indium atoms is greatest near the II-VI/III-V interface, and the concentration decreases substantially monotonically with increasing distance from the interface. This behavior is also depicted in the inset graph 316, which shows in a simplistic fashion the trend of decreasing concentration of indium in the device 102 from the starting surface 102b (or the growth surface 108a) to the ending surface 102a. The increased concentration of indium near the starting surface 102b is positively correlated with the significantly decreased photoluminescent efficiency observed in the RSCs when the starting surface 102b is oriented towards the light source.

We describe herein various techniques for mitigating the detrimental effects of migrating indium atoms. We describe, for example, a variety of semiconductor constructions and techniques effective to deplete the migrating indium within a short distance in the growth layers, or to substantially prevent indium from migrating out of the substrate, or to otherwise substantially isolate functional II-VI layers from the migrating indium, so as to maintain good device performance.

In one approach for mitigating the detrimental effects of migrating indium, we have found that certain additional dopant materials can be added to the initially grown layer or layers of the semiconductor device to deplete the migrating indium within a relatively short distance (thickness) of the III-V/II-VI interface. By depleting the indium in a short distance or thickness of II-VI material, later-formed II-VI material layers, which may be more susceptible to indium contamination, can be made substantially indium-free. Thus, including the certain additional dopant materials in the initially grown device layer(s) allows those initial layer(s) to more effectively capture and isolate the migrating indium so that subsequently grown device layers can be substantially indium-free.

One such additional doping material we have found to be effective in this regard is chlorine. This was confirmed by fabricating a plurality of II-VI semiconductor stacks on InP/GaInAs substrates. Each of the II-VI stacks included one or more layers of CdMgZnSe and one or more layers of CdZnSe grown upon the GaInAs buffer layer on an InP wafer. The total thickness of the II-VI stacks was in each case at least 1.5 microns. Each stack was fabricated with a particular constant level of chlorine doping, but different chlorine doping levels were used from sample to sample. After the II-VI stack fabrication, the ending surface of each stack was evaluated using secondary ion mass spectrometry (SIMS) analysis to determine the concentration of indium as a function of depth in the stack relative to the ending surface. This information yields the profile of indium concentration as a function of depth in each sample. The indium concentration profiles of seven such samples are plotted in FIG. 4, where the profiles have been shifted along the horizontal axis to account for minor differences in overall stack thickness so that the starting surface of the stack (i.e., the interface between the III-V substrate material and the II-VI stack material) in each case occurs at a depth D as shown. The samples exhibited the following chlorine dopant concentrations (as measured using SIMS analysis in a separate scan):

TABLE 1

Figure 4:
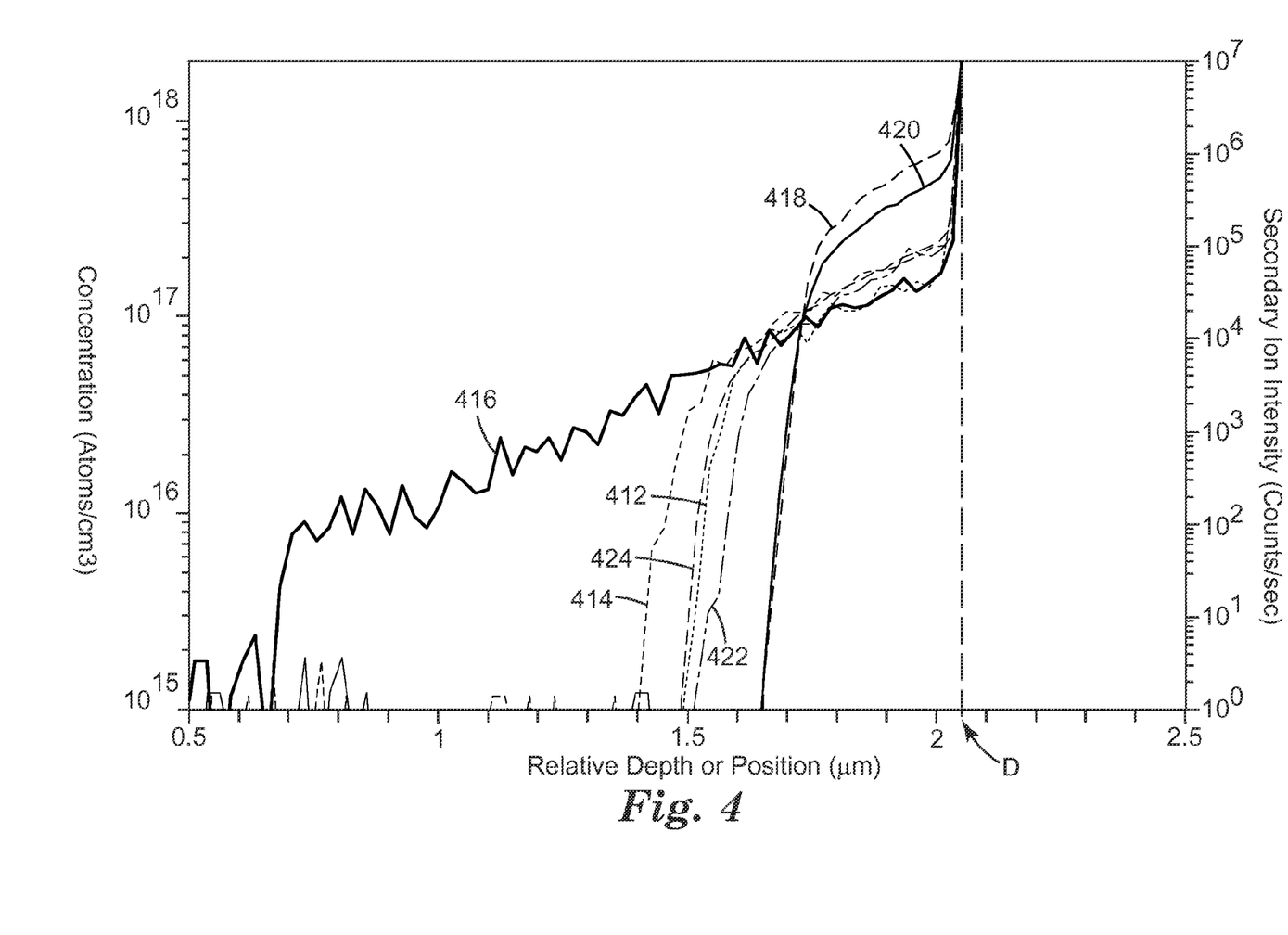
FIG. 4 is a graph of measured indium concentration as a function of depth or position for a variety of II-VI devices grown on an indium phosphide substrate, illustrating the effect chlorine doping can have in reducing the indium migration length or depth.

| Reference numeral | Cl doping density | Distance to depletion of indium |
| --- | --- | --- |
| 416 | 0 | 1.39 |
| 422 | 5.00 | 0.56 |
| 414 | 6.30 | 0.65 |
| 412 | 8.10 | 0.56 |
| 420 | 12.0 | 0.4 |
| 418 | 14.0 | 0.4 |

In the foregoing Table 1, chlorine doping density is expressed in units of $10^{16}$ atoms/cm$^3$, and the "distance to depletion of indium" refers to the distance or thickness from the depth D to the depth at which the indium concentration is depleted to a level of $10^{15}$ atoms/cm$^3$, expressed in microns. The general trend is that the depth of migration of indium into the II-VI layer stack decreases with increasing chlorine doping. This characteristic can be used advantageously in device design by using a relatively high chlorine doping density in one or more initially grown layers proximate the starting surface so as to deplete the migrating indium within a relatively short distance of the III-V/II-VI interface, so that later-formed II-VI material layers, which may be more susceptible to deleterious effects of indium contamination, can be made substantially indium-free. The initially grown layer or layers may be designed to be optically inactive, such as in the case of a window layer with high transmission resulting from a high band gap, or can be sacrificial e.g. by removal after growth (and after removal of the substrate).

Two RSC samples made of II-VI materials were fabricated on InP substrates to demonstrate the effect of chlorine doping. Each of the RSC samples had the following layer structure (with substrate layers included):

TABLE 2

| Layer No. | Composition | Thickness (nm) | Comment |
| --- | --- | --- | --- |
| 1 | CdMgZnSe | 500 | Window layer |
| 2 | CdMgZnSe (graded) | 250 | Window layer |
| 3 | CdMgZnSe: Cl | 58.9 | Absorbing layer |
| 4 | CdZnSe | 2.7 | Quantum well |
| 5 | CdMgZnSe: Cl | 118 | Absorbing layer |
| 6 | CdZnSe | 2.7 | Quantum well |
| 7 | CdMgZnSe: Cl | 118 | Absorbing layer |
| 8 | CdZnSe | 2.7 | Quantum well |
| 9 | CdMgZnSe: Cl | 118 | Absorbing layer |
| 10 | CdZnSe | 2.7 | Quantum well |
| 11 | CdMgZnSe: Cl | 58.9 | Absorbing layer |
| 12 | CdMgZnSe (graded) | 250 | Window layer |
| 13 | CdMgZnSe | 1000 | Window layer |
| 14 | CdZnSe (undoped) | 4 | |
| 15 | GaInAs | 200 | III-V buffer layer |
| 16 (substrate) | InP | 350,000 | III-V base layer |

The starting surface of these samples was the interface between layers 14 and 15, and the ending surface was the exterior of layer 1. The active region consisted essentially of layers 3-11. Note the relatively thick window layers disposed on opposite sides of the active region, and particularly the relatively thick window region (layers 12, 13, and 14, for an aggregate thickness of 1.25 microns) disposed between the starting surface and the active region.

One of the RSC devices, referred to as the "doped window device", was grown with chlorine doping in all of the window layers. The other RSC device, referred to as the "undoped window device", was grown without chlorine doping in any of the window layers. The chlorine doping level in the window layers of the doped device was $1 \times 10^{16}$ atoms/cm$^3$ as measured by C-V. After fabrication, a piece of each device was attached to a separate glass slide with a transparent bonding material, with the ending surface of the device facing the glass slide. The InP and GaInAs layers (layers 15 and 16) were then chemically etched away to expose the starting surface of the devices.

Photoluminescent efficiency measurements were then performed on the devices as constructed, and each device was tested in two orientations: in one case with the starting surface facing the light source (referred to in the table below as orientation "s"), and in the other case with the ending surface facing the light source (referred to as orientation "e"). The results are provided in Table 3:

TABLE 3

| Device description | Orientation | Photoluminescent efficiency (%) |
| --- | --- | --- |
| Undoped device | e | 7 |
| Undoped device | s | 2.3 |

TABLE 3-continued

| Device description | Orientation | Photoluminescent efficiency (%) |
| --- | --- | --- |
| Doped device | e | 26 |
| Doped device | s | 24 |

The doped window device clearly exhibits a more symmetrical response than the undoped window device. Although the overall efficiency of the doped device is much higher than that of the undoped device, it is not clear how much, if any, of this is due to chlorine doping in the window layers. However, the ratio of the photoluminescent efficiencies for the "s" and "e" orientations of a given device, and the difference of that ratio for the doped window device compared to the undoped window device, do appear to be correlated with chlorine doping and the indium-chlorine interaction discussed above.

In summary, we have demonstrated RSC devices that utilize chlorine doping of a II-VI window layer disposed between an indium-containing substrate and a second II-VI layer to effectively deplete migrating indium and prevent the migrating indium from detrimentally impacting device performance.

N-type dopants other than chlorine are expected to provide similar results. Thus, the initially grown layer or layers may include a relatively high doping density of n-type dopants other than chlorine (Cl), e.g., aluminum (Al) and/or gallium (Ga), in order to deplete the migrating indium. Chlorine (Cl), bromine (Br), fluorine (F), and/or iodine (I) may also be useful dopants in this regard.

RSCs with asymmetric layer designs have also been fabricated. In such asymmetric RSCs, the positions of the potential wells may be skewed or biased to be closer to an outer surface of the RSC that is intended to face towards the pump light source, referred to herein as the "illumination surface" of the RSC. In an RSC with a symmetric layer design, the choice of which outer surface to use as the illumination surface is inconsequential (so long as migrating indium effects are dealt with) because the RSC is designed to perform equally well no matter which outer surface is chosen. But in an RSC with an asymmetric layer design, the choice of which outer surface to use as the illumination surface can have a significant impact on device performance. Desirably, the potential well positions are preferentially biased towards the illumination surface, where there are exponentially more photo-generated carriers.

In one class of asymmetric RSC designs, referred to herein as the "standard orientation", the illumination surface is selected to be the ending surface of the RSC, e.g., the outer surface of the last-grown device layer. If such an RSC is designed to include a cyan blocker layer (discussed above), the cyan blocker layer can be made to be relatively thick, e.g., on the order of 2 microns or more, and it is disposed between the starting surface and the active region of the RSC. If desired, the cyan blocker can be made to be relatively thick, e.g., on the order of 2 microns or more, such that doping of chlorine or the other mentioned elements is not necessary in the cyan blocker (or in any other layer of the RSC) to protect the active region of the RSC from migrating indium. In such case, the thickness of the cyan blocker—or of some other semiconductor layer or layers, such as a window layer, that is not part of the active region of the device—is designed to be large enough so that the migrating indium is depleted in the normal course before it can reach the active region of the device. Alternatively, chlorine or other suitable dopants can be used in the cyan blocker or other suitable layers in amounts that are effective to deplete migrating indium atoms over shorter distances.

In another class of asymmetric RSC designs, referred to herein as the "inverted orientation", the illumination surface is selected to be the starting surface of the RSC, e.g., the outer surface of the first-grown device layer. (Note that in cases where a first-grown II-VI semiconductor layer is etched away for some design purpose, the second-grown II-VI semiconductor layer is considered to be the starting device layer, and the outer surface of the second-grown layer is considered to be the starting surface of the device. Similarly, if a last-grown semiconductor device layer is etched away at a later time, the second-to-last-grown semiconductor device layer is considered to be the ending device layer, and the outer surface of this layer is considered to be the ending surface of the device.) Asymmetric RSC designs of the inverted orientation have no need for a thick cyan blocker between the starting surface of the device and the active region. Such RSC designs typically however include one or more window layers in that position, as shown by the following exemplary layer design:

TABLE 4

| Layer No. | Composition | Thickness (nm) | Comment |
|---|---|---|---|
| 1 | Cd0.38Mg0.21Zn0.41Se: Cl | 2000 | cyan blocker/extraction |
| 2 | Cd0.34Mg0.26Zn0.4Se: Cl → Cd0.38Mg0.21Zn0.41Se: Cl | 79.5 | grading |
| 3 | Cd0.34Mg0.26Zn0.4Se: Cl | 58.9 | absorber |
| 4 | Cd0.46Zn0.54Se | 2.4 | quantum well |
| 5 | Cd0.34Mg0.26Zn0.4Se: Cl | 117.8 | absorber |
| 6 | Cd0.46Zn0.54Se | 2.4 | quantum well |
| 7 | Cd0.34Mg0.26Zn0.4Se: Cl | 117.8 | absorber |
| 8 | Cd0.46Zn0.54Se | 2.4 | quantum well |
| 9 | Cd0.34Mg0.26Zn0.4Se: Cl | 117.8 | absorber |
| 10 | Cd0.46Zn0.54Se | 2.4 | quantum well |
| 11 | Cd0.34Mg0.26Zn0.4Se: Cl | 58.9 | absorber |
| 12 | Cd0.2Mg0.48Zn0.32Se: Cl → Cd0.34Mg0.26Zn0.4Se: Cl | 250 | grading |
| 13 | Cd0.2Mg0.48Zn0.32Se: Cl | 1000 | window |
| 14 | Ga0.47In0.53As | 200 | III-V buffer |
| 15 (substrate) | InP | 350 | III-V base |

In the Table 4 design, a 1 micron (1000 nm) thick window layer (layer 13) is used between the starting surface and the active region. However, it can be advantageous to significantly reduce the thickness of this window, e.g., to 0.1 micron or less. The approach of including chlorine or another suitable dopant in the window layer to reduce the migration depth of indium, so as to protect the active region from the deleterious effects of indium, can be used to achieve such desirable thickness reductions.

Discussion

Still other approaches for mitigating the deleterious effects of migrating indium are also contemplated. Note that any of the disclosed approaches can be used individually or in any combination. In one alternative approach, the buffer layer portion of the substrate can be modified during its growth so as to reduce the population of indium ions that migrate into the device layers. In particular, near the end of the growth process of the buffer layer, as the last few monolayers of the crystal matrix of that layer are being formed, indium can be evacuated from the growth chamber so that the last few layers are deficient in indium. Carrying out this procedure on more than a few monolayers may result in an unacceptable number of defects in the otherwise pristine surface of the finished buffer layer which will form the interface between the III-V substrate and the II-VI device layers. Therefore, it is desirable to deplete the indium only insofar as the remaining monolayers are substantially free of dislocations. From the standpoint of thickness, this indium depletion may manifest itself in only the upper few nanometers, or tens of nanometers, of the surface of the buffer layer.

In a related approach, the buffer layer can be fabricated with a chemical composition that does not incorporate indium in the crystal lattice while still maintaining the appropriate lattice constant. For example, the buffer layer may still be substantially lattice matched to an InP base layer. Such an approach can be used to substantially avoid migration of indium from an indium-containing base layer to II-VI device layers. The base layer may be composed of a first III-V semiconductor material such as InP, and the buffer layer may be composed of a second III-V semiconductor material such as doped or undoped GaAsSb, AlAsSb, and/or AlGaAsSb.

One or more of the approaches discussed above can be used to fabricate a variety of semiconductor constructions and devices.

One such semiconductor construction includes a first II-VI semiconductor layer that contains an indium dopant and another dopant, and a second II-VI semiconductor layer formed atop the first layer. The another dopant may be present in the first layer in an amount effective to promote depletion of the indium dopant during a growth phase of the first layer, and the second layer may contain an average concentration of indium that is less than an average concentration of indium in the first layer. The another dopant may comprise an n-type dopant such as aluminum (Al) or gallium (G), or a dopant selected from the group of aluminum (Al), chlorine (Cl), gallium (Ga), bromine (Br), and iodine (I).

Another such semiconductor construction includes a first II-VI semiconductor layer that is nominally lattice-matched to indium phosphide (InP) and that contains an indium dopant. The nominal lattice-matching may be the result of the first II-VI layer being grown from an InP substrate, which substrate was subsequently removed. The indium dopant exhibits a concentration that changes along a thickness direction of the first layer from at least $10^{17}$ atoms/cm$^3$ to less than $10^{16}$ atoms/cm$^3$ over a distance of no more than 1 micron, or over a distance of no more than 0.5 microns.

Structures, systems, and techniques discussed above in connection with RSC semiconductor devices should in general be considered to be equally applicable to VCSEL semiconductor devices, with appropriate consideration given to differences in device design.

Unless otherwise indicated, all numbers expressing quantities, measurement of properties, and so forth used in the specification and claims are to be understood as being modified by the term "about". Accordingly, unless indicated to the contrary, the numerical parameters set forth in the specification and claims are approximations that can vary depending on the desired properties sought to be obtained by those skilled in the art utilizing the teachings of the present application. Not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, to the extent any numerical values are set forth in specific examples described herein, they are reported as precisely as reasonably possible. Any numerical value, however, may well contain errors associated with testing or measurement limitations.

Various modifications and alterations of this invention will be apparent to those skilled in the art without departing from the spirit and scope of this invention, and it should be understood that this invention is not limited to the illustrative embodiments set forth herein. For example, the reader should assume that features of one disclosed embodiment can also be applied to all other disclosed embodiments unless otherwise indicated. It should also be understood that all U.S. patents, patent application publications, and other patent and non-patent documents referred to herein are incorporated by reference, to the extent they do not contradict the foregoing disclosure.

The invention claimed is:

1. A semiconductor construction, comprising:
a III-V semiconductor substrate that contains indium;
at least first and second II-VI semiconductor layers formed atop the III-V semiconductor substrate, the first II-VI semiconductor layer being disposed between the second II-VI semiconductor layer and the III-V semiconductor substrate; and
an interface disposed between the III-V semiconductor substrate and the first II-VI semiconductor layer;
wherein the first II-VI semiconductor layer is adapted to limit the migration of indium from the III-V semiconductor substrate to the second II-VI semiconductor layer, and the first II-VI semiconductor layer includes an n-type dopant in an amount effective to deplete indium that has migrated from the III-V semiconductor substrate.

2. The construction of claim 1, wherein the first and second II-VI semiconductor layers are included in a II-VI semiconductor layer stack, the layer stack being effective to convert light at a first wavelength $\lambda_1$ to light at a second wavelength $\lambda_2$.

3. The construction of claim 1 wherein the first II-VI semiconductor layer exhibits through its thickness an indium concentration gradient of at least a factor of 10.

4. The construction of claim 1, wherein the III-V semiconductor substrate comprises a base layer and a buffer layer, the buffer layer having a major surface corresponding to the interface, and the buffer layer exhibiting an abrupt depletion of indium in monolayers proximate the major surface.

5. The construction of claim 1, wherein the first II-VI semiconductor layer is a window layer.

6. The construction of claim 1, wherein the III-V semiconductor substrate comprises a base layer of indium phosphide (InP).

7. The construction of claim 6, wherein the III-V semiconductor substrate further comprises a buffer layer that contains indium (In).

8. The construction of claim 7, wherein the buffer layer comprises one or more of gallium indium arsenide (GaInAs), aluminum indium arsenide (AlInAs), and gallium indium aluminum arsenide (GaInAlAs).

9. The construction of claim 1, wherein the n-type dopant includes chlorine.

10. The construction of claim 9, wherein the chlorine has a doping density of at least $1 \times 10^{16}$ cm$^{-3}$ in the first II-VI semiconductor layer.

11. The construction of claim 1, wherein the first II-VI semiconductor layer exhibits an indium concentration gradient of at least a factor of 10 over a portion of its thickness, the thickness portion being no more than 1 micron.

12. The construction of claim 11, wherein the thickness portion is no more than 0.6 microns.

* * * * *

UNITED STATES PATENT AND TRADEMARK OFFICE
CERTIFICATE OF CORRECTION

PATENT NO. : 8,994,071 B2  
APPLICATION NO. : 13/264509  
DATED : March 31, 2015  
INVENTOR(S) : Thomas Miller Page 1 of 1

It is certified that error appears in the above-identified patent and that said Letters Patent is hereby corrected as shown below:

Abstract
Line 5, Delete "II-V" and insert -- II-VI --, therefor.

Page 2 (Other Publications)
Line 11, Delete "AIGaInP" and insert -- AlGaInP --, therefor.
Line 29, Delete "eptitaxial" and insert -- epitaxial --, therefor.
Line 49, Delete "Universtity" and insert -- University --, therefor.
Line 51, Delete "Universtity" and insert -- University --, therefor.

Column 1
Line 22, Delete "Efficiency"," and insert -- Efficiency" (Attorney Docket No. 64759US002), --, therefor.
Line 24, Delete "Manufacture"." and insert -- Manufacture" (Attorney Docket No. 65435US002). --, therefor.
Line 66, Delete "Construction"," and insert -- Construction" (Attorney Docket No. 64395US002), --, therefor.

Column 2
Line 40, Delete "Source"," and insert -- Source" (Attorney Docket No. 64116US002), --, therefor.

Signed and Sealed this
Fifth Day of April, 2016

Michelle K. Lee
*Director of the United States Patent and Trademark Office*